(12) United States Patent
Nagai

(10) Patent No.: US 6,906,600 B2
(45) Date of Patent: Jun. 14, 2005

(54) SURFACE ACOUSTIC WAVE DEVICE AND BRANCHING FILTER WITH SPECIFIED SIGNAL TERMINAL LOCATIONS

(75) Inventor: Tatsuro Nagai, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 42 days.

(21) Appl. No.: 10/337,990

(22) Filed: Jan. 8, 2003

(65) Prior Publication Data

US 2003/0132817 A1 Jul. 17, 2003

(30) Foreign Application Priority Data

Jan. 8, 2002 (JP) ....................... 2002-001635

(51) Int. Cl.[7] ............................. H03H 9/72; H03H 9/64
(52) U.S. Cl. ...................................... 333/133; 333/193
(58) Field of Search ................................ 333/193–196, 333/133

(56) References Cited

U.S. PATENT DOCUMENTS

| | | | | |
|---|---|---|---|---|
| 5,554,960 A | * | 9/1996 | Ohnuki et al. | 333/132 |
| 5,952,899 A | * | 9/1999 | Kadota et al. | 333/193 |
| 6,339,365 B1 | * | 1/2002 | Kawase et al. | 333/193 |
| 6,388,545 B1 | * | 5/2002 | Kawachi et al. | 333/193 |
| 6,720,842 B2 | * | 4/2004 | Sawada | 333/133 |
| 6,791,437 B2 | * | 9/2004 | Hagn et al. | 333/195 |

FOREIGN PATENT DOCUMENTS

| | | | | |
|---|---|---|---|---|
| JP | 60-185419 | * | 9/1985 | 333/195 |
| JP | 06-097759 | | 4/1994 | |
| JP | 07-226607 | | 8/1995 | |
| JP | 07-264000 | | 10/1995 | |
| JP | 8-293756 | * | 11/1996 | |
| JP | 09-181567 | | 7/1997 | |
| JP | 10-70435 | * | 3/1998 | |
| JP | 11-017495 | | 1/1999 | |
| JP | 2000-49565 | * | 2/2000 | |
| JP | 2001-339266 | | 12/2001 | |
| JP | 2002-217680 | * | 8/2002 | |
| KR | 2000-0003061 | | 2/2000 | |
| WO | WO 01/71911 A1 | * | 9/2001 | |

* cited by examiner

Primary Examiner—Barbara Summons
(74) Attorney, Agent, or Firm—Keating & Bennett LLP

(57) ABSTRACT

A surface acoustic wave filter includes a surface acoustic device on a reception side which has signal terminals for inputting and outputting located in a corner along a diagonal and a surface acoustic wave device on the transmission side which has signal terminals for inputting and outputting at ends on one side. The surface acoustic wave devices are provided on a circuit board such that the signal terminals are located close to each other and connected to a wiring pattern on the antenna side.

13 Claims, 14 Drawing Sheets

SURFACE ACOUSTIC WAVE DEVICE AND BRANCHING FILTER WITH SPECIFIED SIGNAL TERMINAL LOCATIONS

BACKGROUND OF THE INVENTION

1. Field of the Invention

The present invention relates to a surface acoustic wave device for branching filters, which are preferably used as electronic components for portable telephones and other apparatuses, and also relates to a branching filter including a surface acoustic wave device.

2. Description of the Related Art

In a related surface acoustic wave device (hereinafter, a surface acoustic wave device will be called a SAW device) shown in FIG. 9, a package 27 substantially in the form of a rectangular block, having a surface acoustic wave filter (hereinafter, called a SAW filter) housed on the inner surface thereof, is provided and signal terminals 27a and 27b for inputting and outputting to and from the SAW filter are provided at the center of groups of terminals including the signal terminals 27a and 27b and grounding terminals 27c arranged in a line, that is, in the middle of each side of the outer surface of the package 27.

In the above-described SAW filter, a plurality of comb-shaped electrode portions (interdigital transducers, hereinafter, called IDTs) is arranged on a piezoelectric substrate such that the IDTs are connected to the signal terminals for inputting and outputting and the grounding terminals to perform a filtering function. In the above-described SAW filter, when an AC electrical signal is input to one IDT, a surface acoustic wave is generated on the piezoelectric substrate by the IDT, propagates on the piezoelectric substrate, and the propagated surface acoustic wave is detected by another IDT to produce and output an electrical signal, thus performing a filtering function.

Such a SAW device, for example, a SAW device in which, as shown in FIGS. 10A and 10B, the signal electrodes of the SAW filter 37 are connected to internal signal electrodes 37a and 37b in the package 27 by bonding wires 30 and 31, is shown in Japanese Unexamined Patent Application Publication No. 7-264000.

Furthermore, in Japanese Unexamined Patent Application Publication No. 6-97759, as shown in FIGS. 11A and 11B, a SAW device in which the signal electrodes of a SAW filter 42 are connected to electrodes 47a and 47b of the package 27 by bump bonding is disclosed.

A branching filter, in which two SAW devices are mounted on the transmission and reception sides on a circuit board, is known. In the SAW device of the branching filter, in which a signal from the antenna is first filtered, each SAW filter on the transmission and reception sides is required to have a large attenuation in the pass band.

In order to reduce the size of a branching filter having such SAW devices, in Japanese Unexamined Patent Application Publication No. 9-181567, as shown in FIGS. 12 and 13, each side of the package including the SAW devices is rotated 45 degrees with respect to each side of a circuit board 51, the packages 27 are mounted on the circuit board 51, and the external terminals of the circuit board 51 are connected to the terminals of the SAW devices by a wiring pattern on the circuit board 51.

Moreover, in Japanese Unexamined Patent Application Publication No. 11-17495, as shown in FIG. 14, the packages 27 of the SAW devices configured as shown in FIG. 9 are mounted on a circuit board 61.

However, in a branching filter including the above-described SAW devices, the electrodes connecting the signal terminals become longer, and therefore there is a problem in that the attenuation cannot be increased in the pass band.

On the other hand, in an electronic component in which the SAW devices are mounted on a printed-circuit board or a ceramic substrate and arranged in modules, there is a problem in that, because of the trend toward a reduction in size, sufficient grounding surface cannot be obtained and therefore, the attenuation cannot be increased in the pass band.

Furthermore, in the related SAW devices, since the packages are to be shared by other electronic components and wire bonding should be simple, the signal terminals are disposed in the middle of the sides of the packages. However, when the signal terminals are disposed in the middle of the sides of the packages, since the grounding terminals are disposed at both ends of these sides, the attachment surface of a portion to be connected to the grounding terminals is divided into sections and the area is thus reduced, and also there is a problem in that the grounding becomes insufficient because the grounding electrode is divided. In addition, since the wires connecting the signal terminals of the package and the IDTs become close to each other at the input and output terminals, there is a problem in that interference between the wires degrades the characteristics.

SUMMARY OF THE INVENTION

In order to solve the above-described problems, a SAW device of preferred embodiments of the present invention includes a package, a SAW filter mounted in the package, the package having signal terminals on at least two sides thereof, and a signal terminal for inputting and a signal terminal for outputting for the SAW filter. In the SAW device, at least one of the signal terminal for inputting and the signal terminal for outputting is disposed at the end of one side of the package.

Another SAW device of preferred embodiments of the present invention includes a package, a SAW filter mounted in the package, the package having signal terminals on at least two sides thereof, and a signal terminal for inputting and a signal terminal for outputting for the SAW filter. In the SAW device, at least one of the signal terminal for inputting and the signal terminal for outputting is disposed at a corner of the package.

Another SAW device of preferred embodiments of the present invention includes a package, a SAW filter mounted in the package, the package having signal terminals on at least two sides thereof, and a signal terminal for inputting and a signal terminal for outputting for the SAW filter. In the SAW device, the signal terminal for inputting and the signal terminal for outputting are disposed on a diagonal between the two opposing sides in the package and at the ends of the two sides.

According to the above-described construction, when at least one signal terminal of the signal terminals is disposed at the end of one side of the package, at a corner of one side of the package, or on a diagonal between the two opposing sides in the package and at the ends of the two sides, a wiring pattern connected to the signal terminals is shortened, interference outside the pass band is minimized, and the attenuation outside the pass band is increased.

Furthermore, according to the above-described construction, when the signal terminals are disposed at the ends and corners, the grounding terminals can be grouped together, and, for example, when the signal terminals are mounted on a circuit board such as a PCB board or other substrate, the grounding on the surface for attaching a chip on the circuit board is strengthened and the transmission characteristics such as attenuation characteristics, etc., are significantly improved.

Moreover, according to the above-described construction, when the signal terminals are disposed at the ends, corners, and on a diagonal, the distance between the signal terminals can be made much longer than previously possible, and, accordingly, for example, the distance between wires connected to the signal terminals is increased and the transmission characteristics are greatly improved.

In addition, according to the above-described construction, since the distance between the signal terminals can be assured, for example, leakage of a signal from the reception side to the transmission side can be prevented and the direct wave caused between the wires connected to the signal terminals can be more suppressed than previously possible. As a result, the transmission characteristics are greatly improved.

In order to solve the above problems with the conventional devices, in a branching filter of another preferred embodiment of the present invention, at least one of the above-described SAW devices is included and mounted on a circuit board.

According to the above-described construction, since a SAW device of one of the preferred embodiments of the present invention is included and accordingly the attenuation outside the pass band is increased, for example, when two SAW devices having different pass frequency bands are included, the attenuation in the pass band can be increased and, as a result, the transmission characteristics can be improved.

In the branching filter, it is more desirable that at least two SAW devices for transmission and reception are provided and that the two SAW devices are disposed such that signal terminals shared by both devices are arranged so as to be adjacent to each other on antenna sides of the two SAW devices.

According to the above-described construction, since the two SAW devices are disposed such that the signal terminals shared by both devices on the antenna side of the two SAW devices are located adjacent to each other, the wiring pattern connected to the signal terminals can be more assuredly shortened, and accordingly interference is significantly suppressed in the pass band and the attenuation can be increased in the pass band.

In the above-described branching filter, at least two SAW devices for transmission and reception are provided and the signal terminal for inputting and the signal terminal for outputting in the SAW device for reception are disposed on a diagonal of the package.

According to the above-described construction, in the SAW device for reception, since the signal terminals are disposed on a diagonal of the package, the distance between the signal terminals can be made much longer than previously possible. Therefore, the distance between the wires connected to the signal terminals is increased, the coupling between the wires is suppressed, and the attenuation in the pass band on the transmission side can be increased by the SAW device for reception.

Furthermore, according to the above-described construction, as described above, the area for attaching a chip can be increased and the grounding is strengthened, and accordingly, the attenuation in the pass band on the transmission side can be increased by the SAW device for reception.

In the above-described branching filter, the signal terminal for inputting and the signal terminal for outputting in the SAW device for transmission are preferably disposed at the two ends of the same side of the package.

According to the above-described construction, when compared with the case where a SAW filter having signal terminals for inputting and outputting are disposed in the middle of the two sides of the package, the wiring can be made easier and shorter and the branching filter can be made smaller.

In the above-described branching filter, it is more desirable that at least two SAW devices for transmission and reception are provided and the input-side terminal of the SAW device for transmission and the output-side terminal of the SAW device for reception are disposed at sides which are different from the sides located adjacent to each other in the SAW devices.

According to the above-described construction, because of the unique arrangement, the wiring pattern connected to the signal terminals is more assuredly made short, interference is minimized in the pass band, and the attenuation is increased in the pass band.

In the above-described branching filter, it is desirable that the input-side terminal of the SAW device for transmission and the output-side terminal of the SAW device for reception are disposed along a diagonal of the circuit board.

According to the above-described construction, due to the unique arrangement, the wiring pattern connected to the signal terminals is more assuredly made short, interference is minimized in the pass band, and the attenuation can be increased in the pass band.

Moreover, according to the above-described construction, due to the unique disposition, the input terminal of the SAW device for transmission and the output terminal of the SAW device for reception are more assuredly separated from each other, and accordingly the isolation between the transmission side and the reception side is high.

In addition, according to the above-described construction, since the space between the signal terminals (ANT., TX, and Rx) of the branching filter is greater than in the related products, the wave directly arriving in the branching filter and the wave directly arriving in the circuit board is minimized.

In the above-described branching filter, it is more desirable that the package of the SAW device for transmission and the package of the SAW device for reception are mounted so as to be spaced from each other.

In the above-described branching filter, a matching electronic component to be connected to a coupling portion on the antenna side in the SAW devices for transmission and reception is provided and a conductive cover is mounted so as to cover the matching electronic component and the surface acoustic wave devices.

In the above-described branching filter, a matching electronic component to be connected to a coupling portion on the antenna side in the SAW devices for transmission and reception is provided and a conductive cover is mounted so as to cover the matching electronic component and the SAW devices.

Other features, elements, characteristics and advantages of the present invention will become more apparent from the following detailed description of preferred embodiments with reference to the attached drawings.

DETAILED DESCRIPTION OF PREFERRED EMBODIMENTS

With reference to FIGS. 1 to 8B, preferred embodiments of the present invention will be described below.

Figure 2:
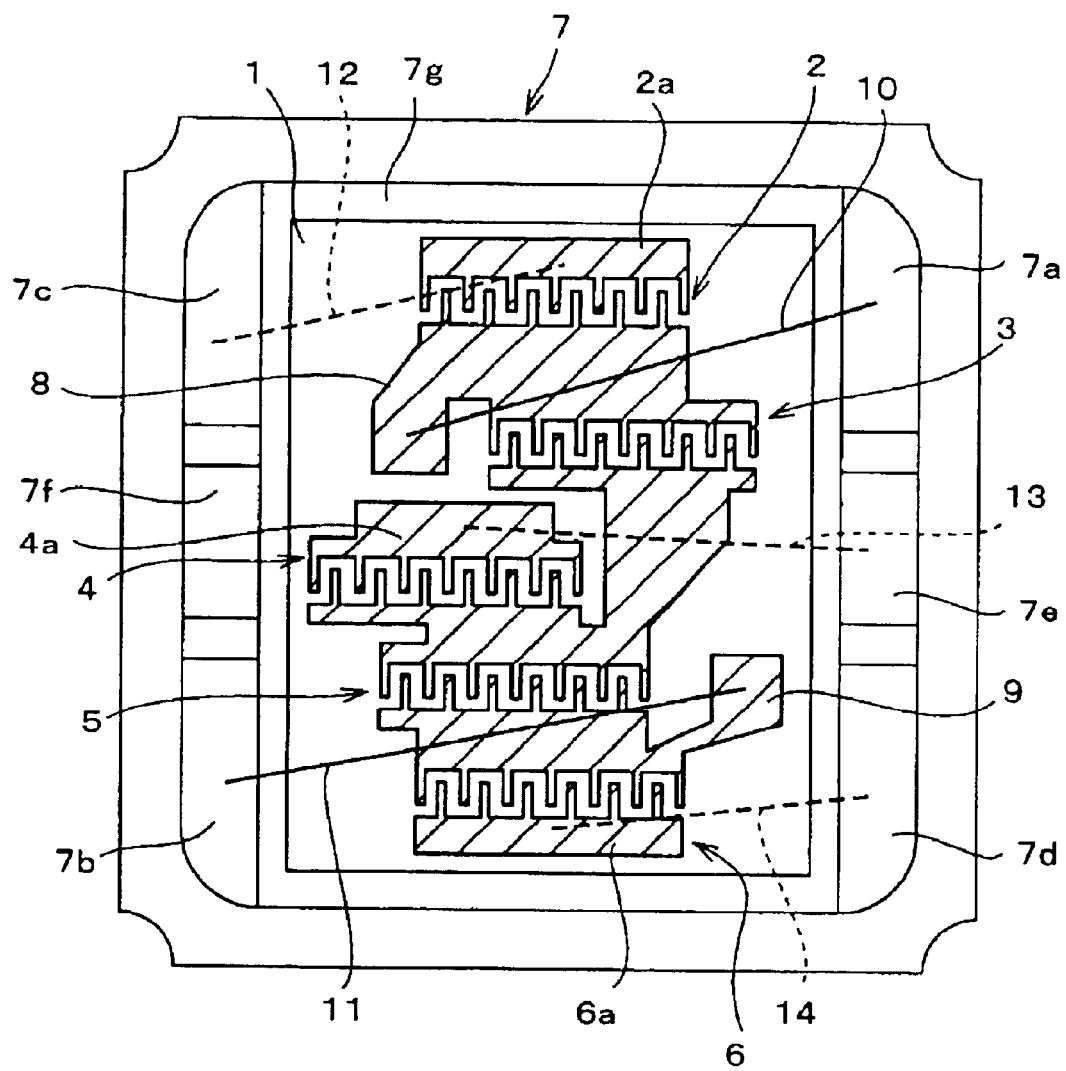
FIG. 2 is a top view of the principal portion of a SAW device included in the branching filter of FIG. 1.

In a SAW device according to a preferred embodiment of the present invention, as shown in FIG. 2, a plurality of IDTs, for example, five IDTs 2 to 6 are arranged so as to be, for example, transversely coupled IDTs on a piezoelectric substrate made of, for example, 40±5° Y-cut X-propagation LiTaO$_3$. Other substrates may also be used.

The IDTs 2 to 6 preferably include strip-shaped base portions (bus bars) and two electrode-finger portions having a plurality of strip-shaped electrode fingers, disposed substantially parallel to each other, which extend from one side of the base portion in a direction that is substantially perpendicular to the base portion, and the electrode fingers of one electrode-finger portion are inserted between the electrode fingers of the other electrode-finger portion so as to face each other.

In such IDTs 2 to 6, the signal conversion characteristics and the pass band can be changed by setting the length and width of each electrode finger, the distance between adjacent electrode fingers, and the overlapping length of two opposing electrode fingers.

Furthermore, in the SAW device, a package 7, preferably having a box-like configuration including a bottom which is substantially rectangular, is arranged such that a piezoelectric substrate 1 is housed in the middle of the inner surface 7g. Moreover, internal electrodes 7a and 7b for input-output signals are provided in the corner portions on a diagonal of a substantially rectangular inner surface 7g around the inner surface 7g, at a different location from where the piezoelectric substrate 1 is housed in the package 7.

Furthermore, on the inner surface 7g, internal electrodes 7c and 7d for grounding are provided in the other corners, an internal electrode 7e for grounding is provided between the internal electrode 7a for an input-output signal and the internal electrode 7d for grounding, and an internal electrode 7f for grounding is provided between the internal electrode 7b for an input-output signal and the internal electrode 7c for grounding.

The internal electrode 7a for one input-output signal and a signal electrode 8 functioning as a common electrode for the IDT 2 and IDT 3 are connected by a bonding wire 10 inside the package 7. The internal electrode 7b for the other input-output signal and a signal electrode 9 functioning as a common electrode for the IDT 5 and IDT 6 are connected by a bonding wire 11 inside the package 7. Furthermore, the other bus bar 2a of the IDT 2 is grounded by the internal electrode 7c for grounding and a bonding wire 12. One bus bar 4a of the IDT 4 is grounded by the internal electrode 7e for grounding via a bonding wire 13 inside the package 7. The other bus bar 6a of the IDT 6 is grounded by the internal electrode 7d for grounding via a bonding wire 14.

Figure 3:
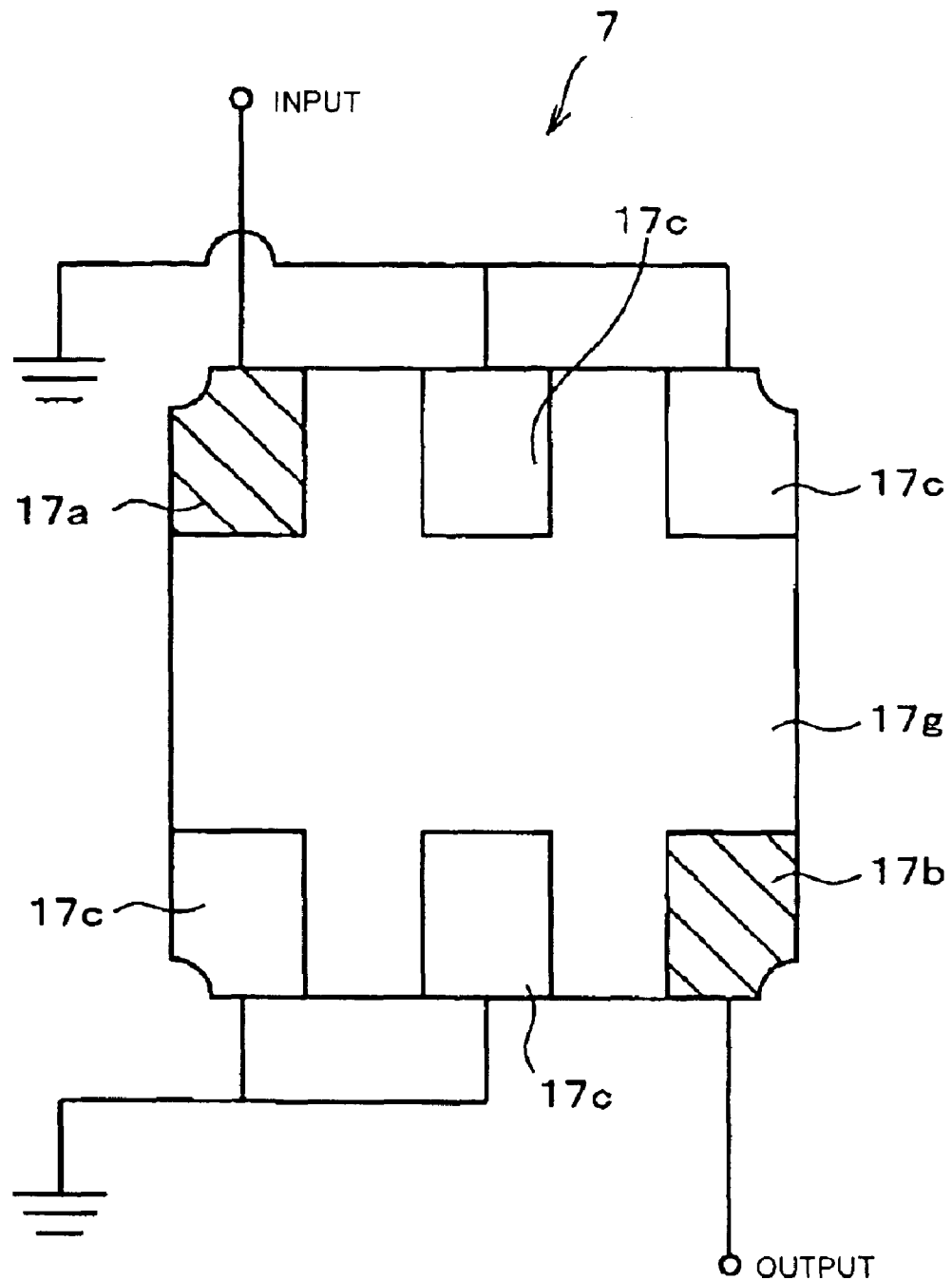
FIG. 3 is a schematic illustration showing the arrangement of signal terminals and grounding terminals in a package of the SAW device of a preferred embodiment of the present invention.

As shown in FIG. 3, signal terminals 17a and 17b to be connected to the outside are provided at locations facing the internal electrodes 7a and 7b for signals on the outer surface 17g, opposite to the inner surface 7g, in the package 7, and grounding terminals 17c are provided at locations facing each of the internal electrodes 7c to 7f for grounding. Accordingly, the signal terminals 17a and 17b are provided in the corner portions on a diagonal of the substantially rectangular outer surface 17g.

Figure 4:
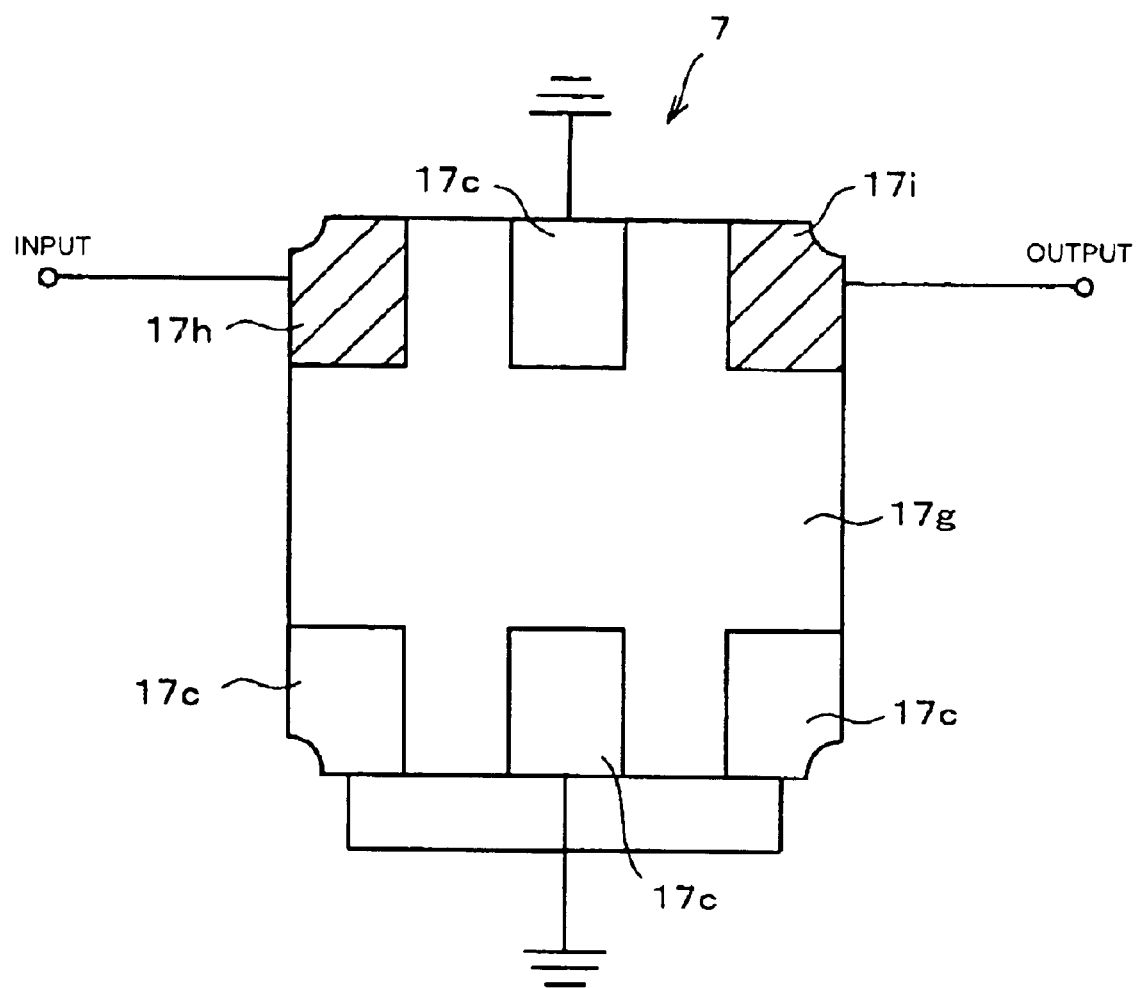
FIG. 4 is a schematic illustration showing one modification of the arrangement in FIG. 3.

Moreover, although the signal terminals 17a and 17b are provided in the corner portions on a diagonal of the outer surface 17g as described above, as an example, signal terminals 17h and 17i may be provided at both ends (corners) of one side of the outer surface 17g, as shown in FIG. 4. The signal terminals 17h and 17i function in the same way as the signal terminals 17a and 17b.

In such a SAW device, since at least one signal terminal of the input-output signal terminals is provided at the end of one side, the disposition of any signal terminal between adjacent grounding terminals 17 can be prevented, Accordingly, the grounding terminals 17c can be arranged so as to be adjacent to each other in order to group them together. In this way, the outer surface 17g, which is the surface used for attaching a chip, is significantly strengthened and the transmission characteristics of the package 7 is greatly improved.

Figure 5:
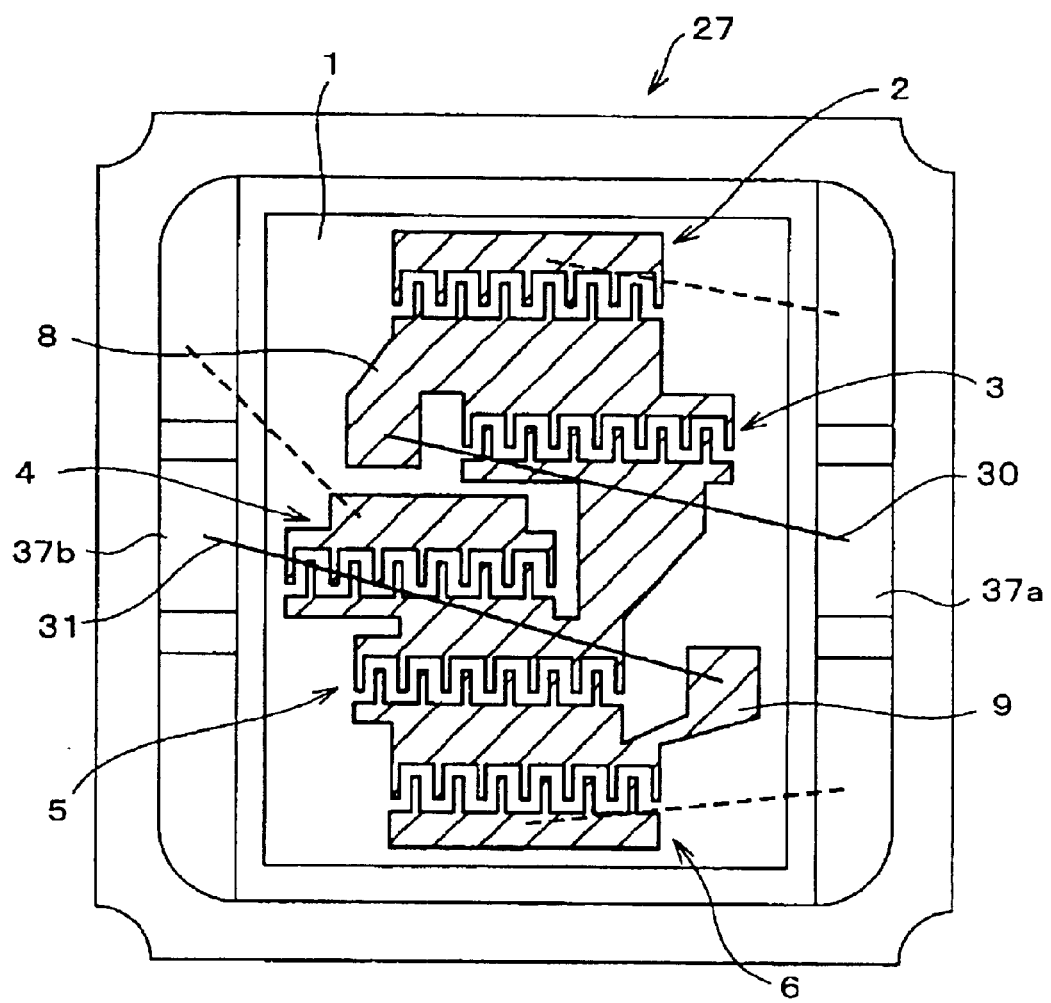
FIG. 5 is a top view of the principal portion of another SAW device for comparison to a preferred embodiment of the present invention.
Figure 9:
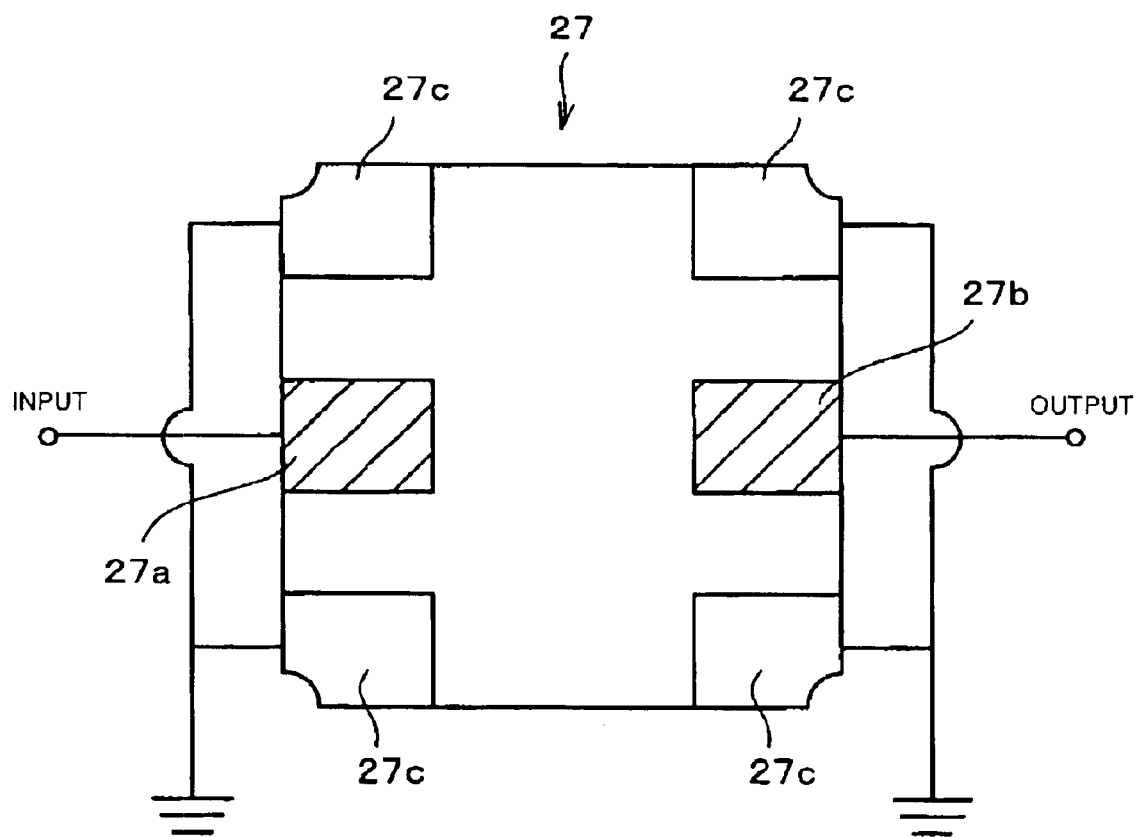
FIG. 9 is a schematic illustration showing the arrangement of signal terminals and grounding terminals in a package of a related SAW device.
Figure 10A:
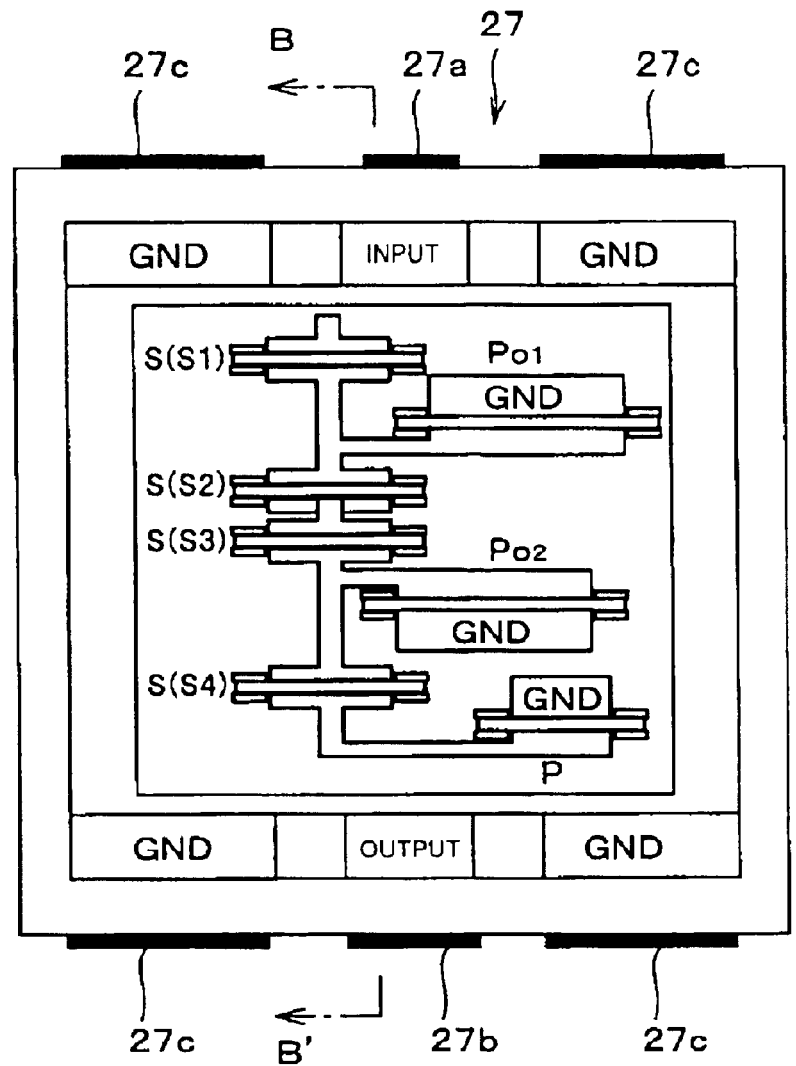
FIG. 10A is a top view of one example of the related SAW device.
Figure 10B:
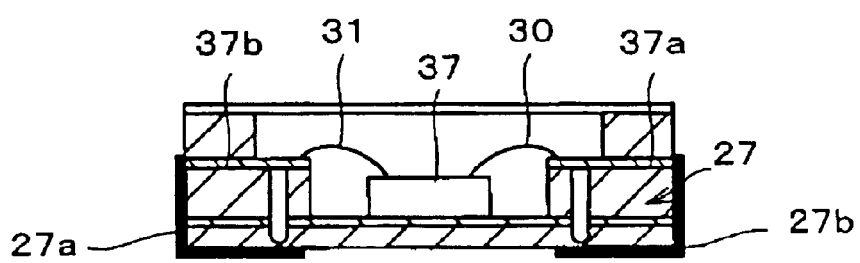
FIG. 10B is a sectional view of the example of the related SAW device shown in FIG. 10A.
Figure 11A:
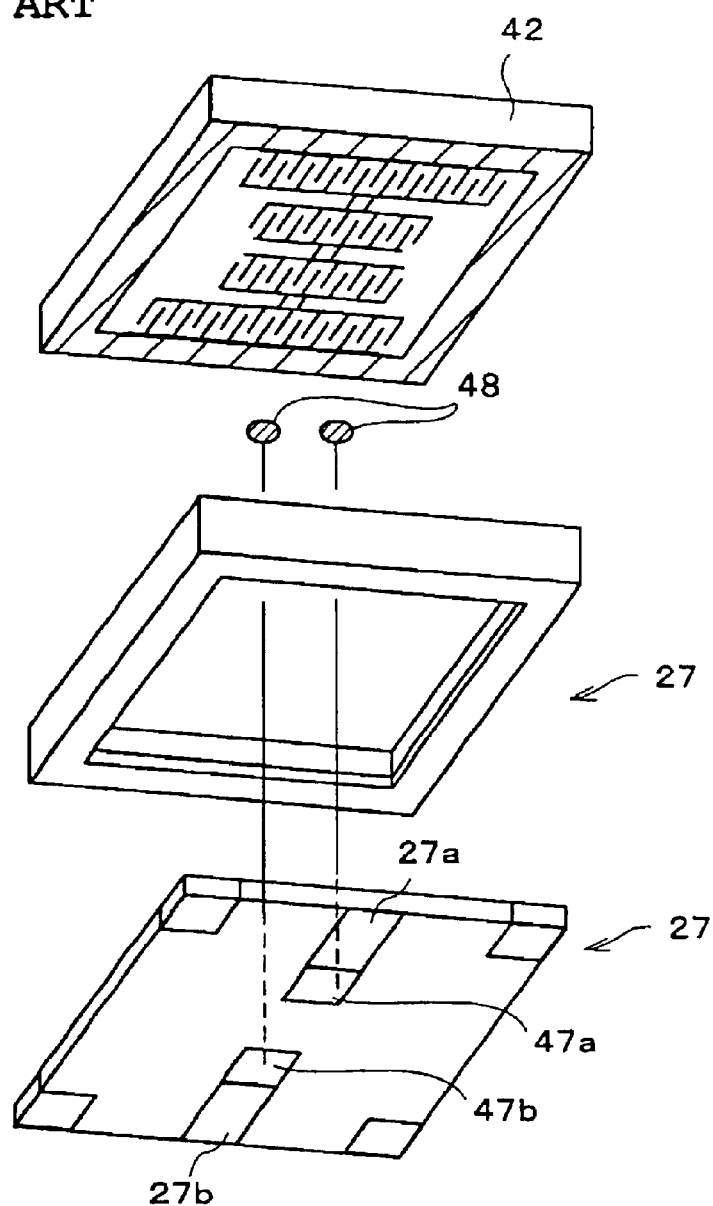
FIG. 11A is an exploded perspective view of another example of the related SAW device.
Figure 11B:
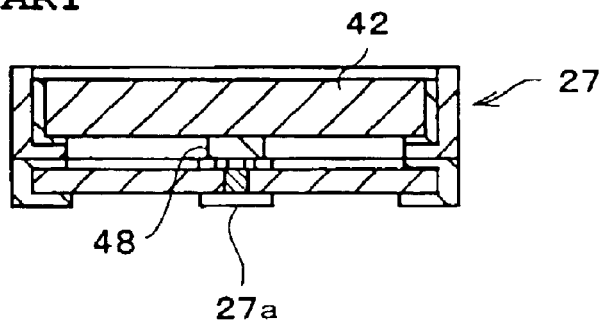
FIG. 11B is a sectional view of the other example of the related SAW device shown in FIG. 11A.

In the related SAW device shown in FIG. 9, each of the signal terminals 27a and 27b is provided in the middle of the opposing sides, in the package 27 constructed in the same way as the package 7. Then, for comparison purposes, as shown in FIG. 5, a SAW device for comparison was produced. In this SAW device, an internal electrode 37a for one input-output signal and a signal electrode 8 are connected using a bonding wire 30 corresponding to the wire 10 and an internal electrode 37b for the other input-output signal and a signal electrode 9 are connected using a bonding wire 31 corresponding to the wire 11.

In such a SAW device, since the wires 30 and 31 are connected to the internal signal electrodes 37a and 37b in the middle portions, respectively, the wires 30 and 31 become close to each other.

However, in preferred embodiments of the present invention, since the wires 10 and 11 are connected to the internal signal electrodes 7a and 7b, respectively, disposed in the corner portions, the wires 10 and 11 are separated from each other more than in the related SAW device and they can be made substantially parallel to each other by maintaining a certain distance between the wires 10 and 11, and accordingly signal leakage from the reception side to the transmission side is reliably prevented. Thus, in preferred embodiments of the present invention, a direct wave caused between the wires 10 and 11 is minimized more than in the SAW device for comparison and thus, the transmission characteristics are greatly improved in preferred embodiments of the present invention.

To investigate the improvement of the transmission characteristics, the transmission characteristics of the SAW device according to preferred embodiments of the present invention shown in FIGS. 2 and 3 and the SAW device for comparison shown in FIG. 5 were obtained. The results are shown together in FIG. 6 (a preferred embodiment of the present invention is shown by a solid line and the device for comparison is shown by a broken line).

As is clear from the graph, since the grounding area is increased in the chip mounting area and the grounding is thus strengthened, the attenuation is greatly increased outside the passband. Therefore, when a SAW device of preferred embodiments of the present invention is used in a branching filter, as described later, the branching filter is vastly improved such that the attenuation is significantly increased.

Figure 6:
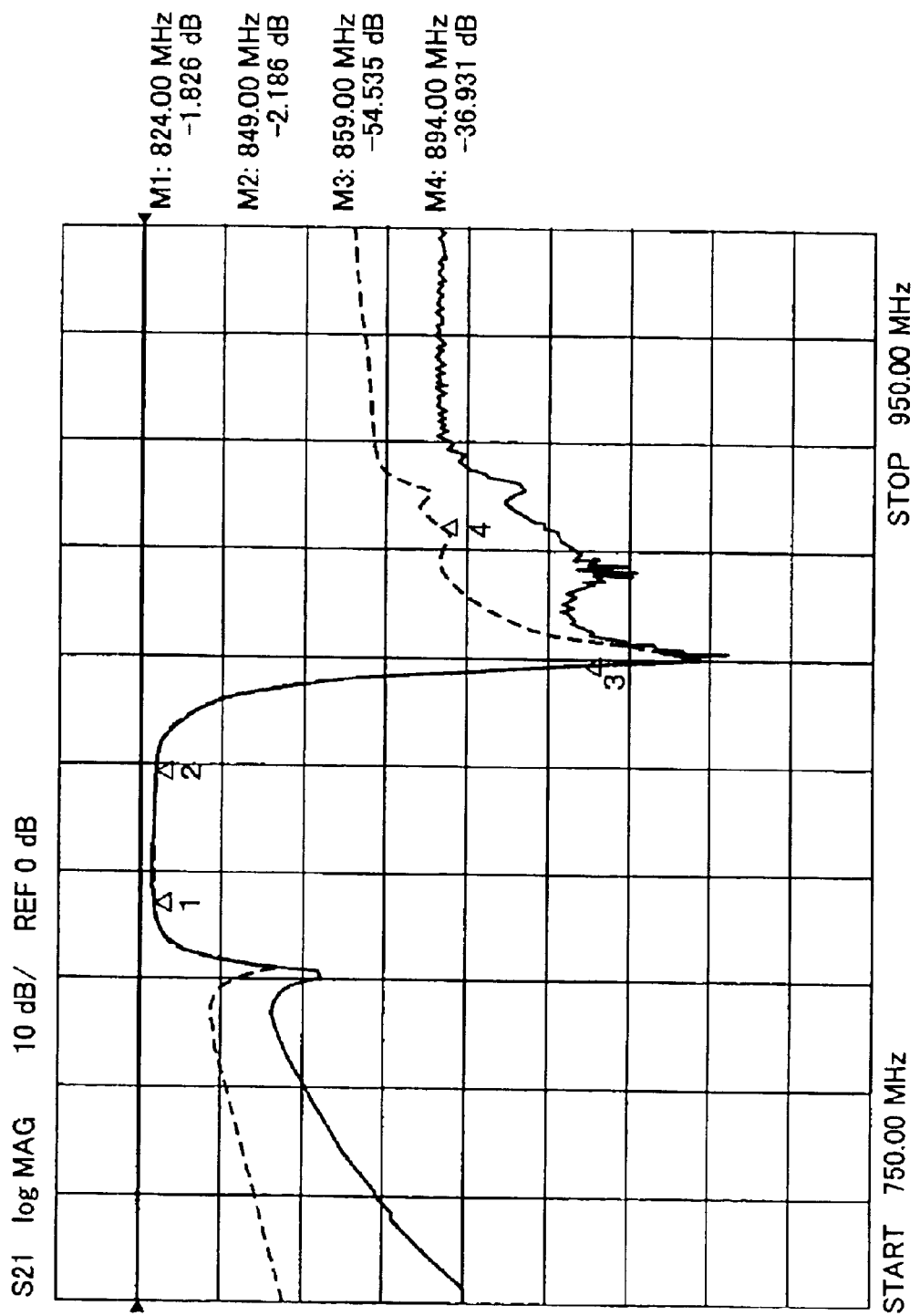
FIG. 6 is a graph showing the transmission characteristics of the SAW device of preferred embodiments of the present invention and the SAW device for comparison.

Furthermore, it is understood that, as shown in FIG. 6, the attenuation pole in preferred embodiments of the present invention is larger than that in the SAW device for comparison. Because of such a large attenuation pole, not only in a SAW device of preferred embodiments of the present invention and a branching filter (DPX) having the SAW device described later, but also in an electronic component in which internal signal electrodes (signal terminals) of preferred embodiments of the present invention are disposed, the manufacturing tolerance can be increased and the yield of the electronic components can be improved.

Figure 1:
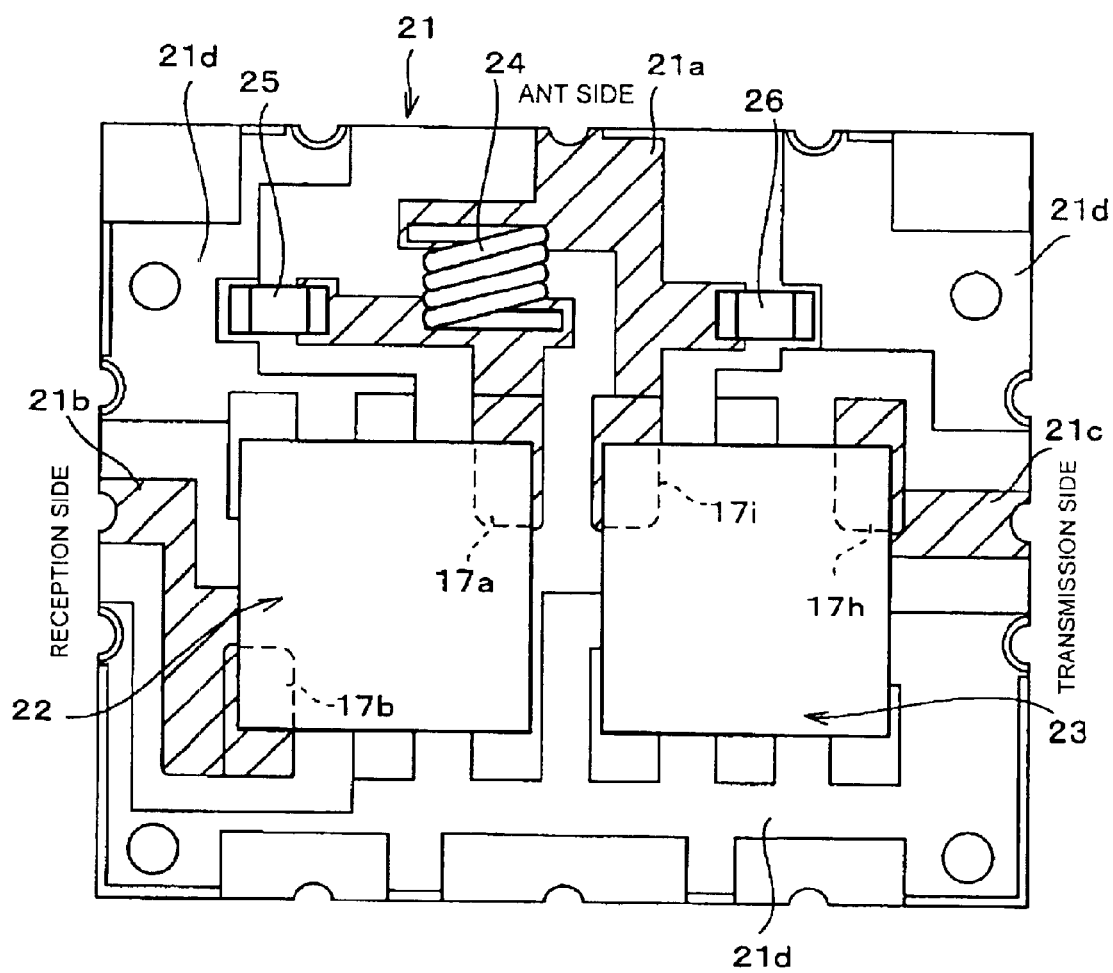
FIG. 1 is a top view of the principal portion of a branching filter of a preferred embodiment of the present invention.

In a branching filter according to another preferred embodiment of the present invention shown in FIG. 1, two SAW devices 22 and 23 for transmission and reception and matching elements 24, 25, and 26, functioning as matching LC elements, which are connected to a wiring pattern 21a for connection in an antenna coupling portion, are mounted.

The SAW devices 22 and 23 are the above-described SAW device according to preferred embodiments of the present invention, and at least one signal terminal of the input-output signal terminals is provided at the end of one side of the package. Moreover, as shown in FIGS. 1 and 3, in the package 7 of the reception-side SAW device 22, the signal terminals 17a and 17b are disposed on two sides of the package 7 on a diagonal. On the other hand, in the package 7 of the transmission-side SAW device 23, the signal terminals 17h and 17i are disposed only on one side of the package, and at the ends of that side.

When the two SAW devices 22 and 23 are mounted such that they are located side-by-side on a printed-circuit board, so that the opposing sides are substantially parallel and such that the sides adjacent the opposing sides are substantially on the same line, the signal terminals 17a and 17i on the antenna side of the SAW devices 22 and 23 on the transmission and reception sides are connected to the wiring pattern 21a by bump bonding, and the SAW devices 22 and 23 can be mounted so as to be close to each other on the circuit board 21.

Furthermore, the other signal terminal 17b of the SAW device 22 is connected to a wiring pattern 21b on the reception side on the circuit board 21. The other signal terminal 17h of the SAW device 23 is connected to a wiring pattern 21c on the transmission side on the circuit board 21.

Moreover, the wiring pattern 21a is connected to an ANT external terminal (not illustrated) on the back side (opposite side of the surface where the wiring pattern is disposed) of the circuit board 21 through a first through-hole in the middle of the side on the ANT side of the circuit board 21. The wiring pattern 21b is connected to an Rx external terminal (not illustrated) on the back side of the circuit board 21 through a second through-hole in the middle of the side adjacent the ANT side. The wiring pattern 21c is connected to a Tx external terminal (not illustrated) on the back side of the circuit board 21 through a third through-hole in the middle of the side adjacent the ANT side and located opposite to the second through-hole.

Figure 12:
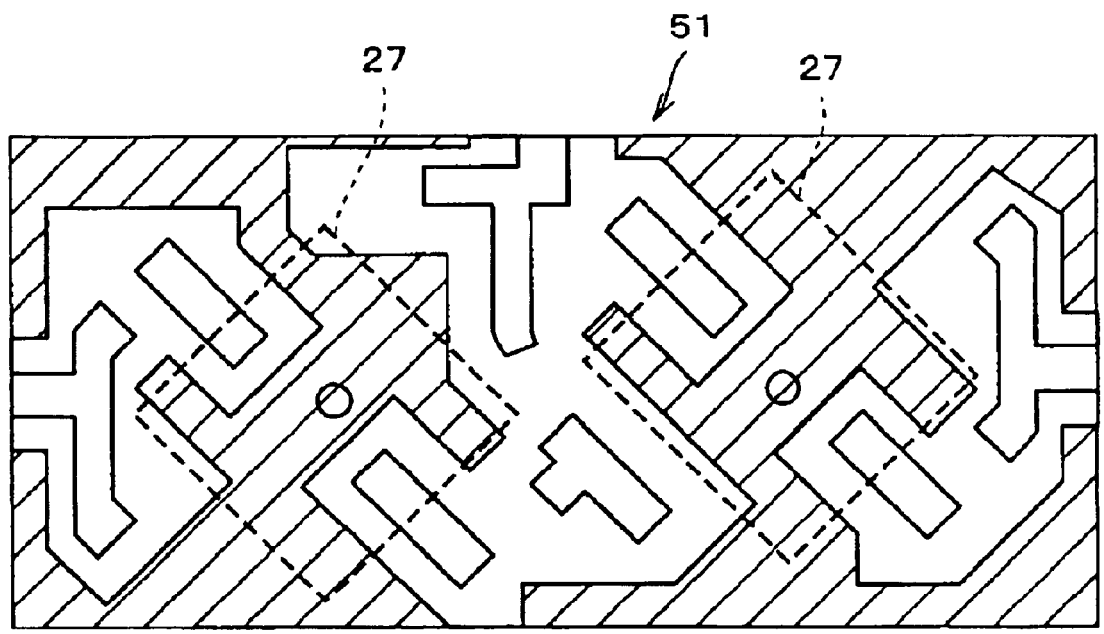
FIG. 12 is a top view showing the principal portion of one example of a related branching filter.
Figure 13:
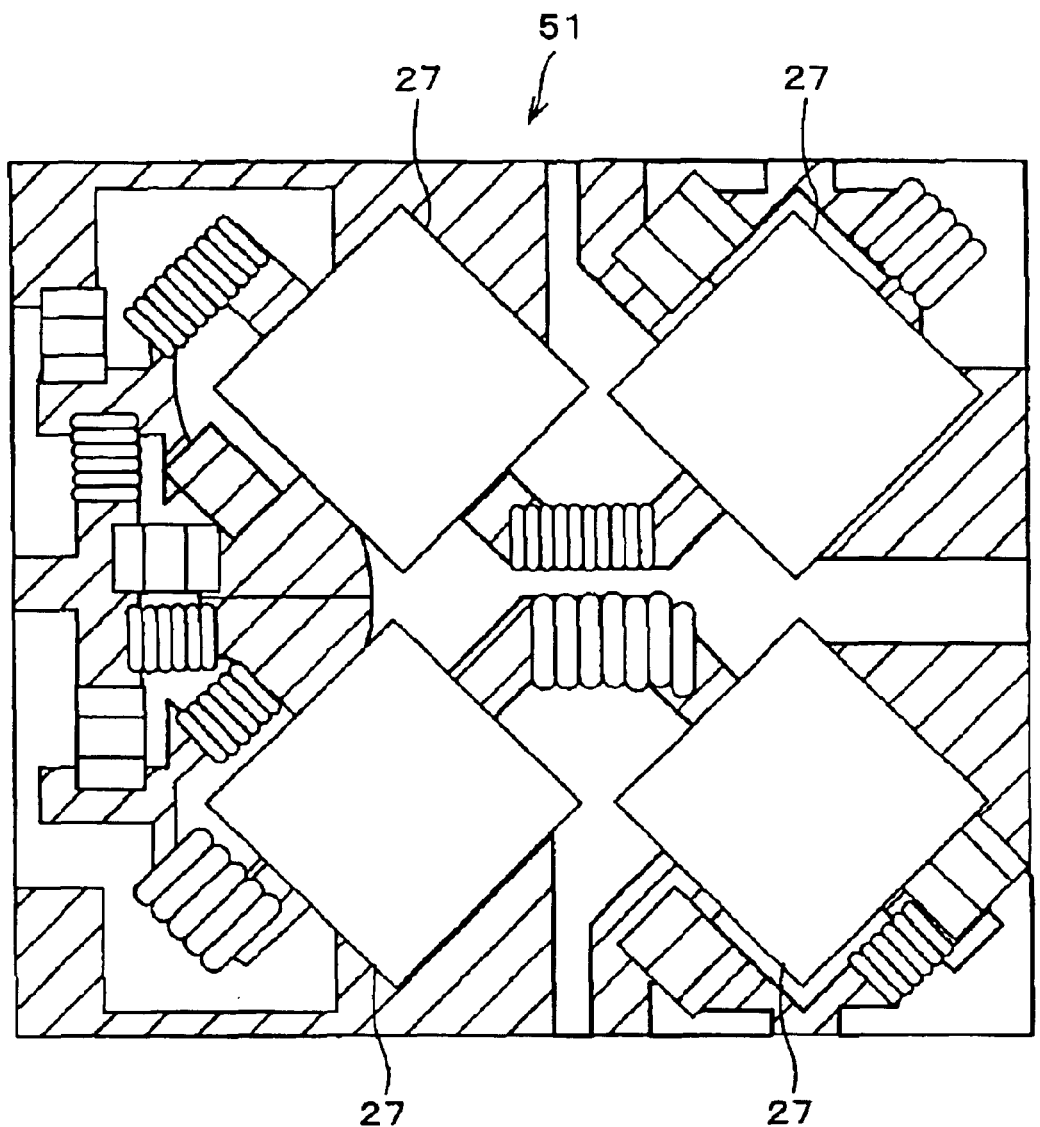
FIG. 13 is a top view showing the principal portion of another example of a related branching filter.
Figure 14:
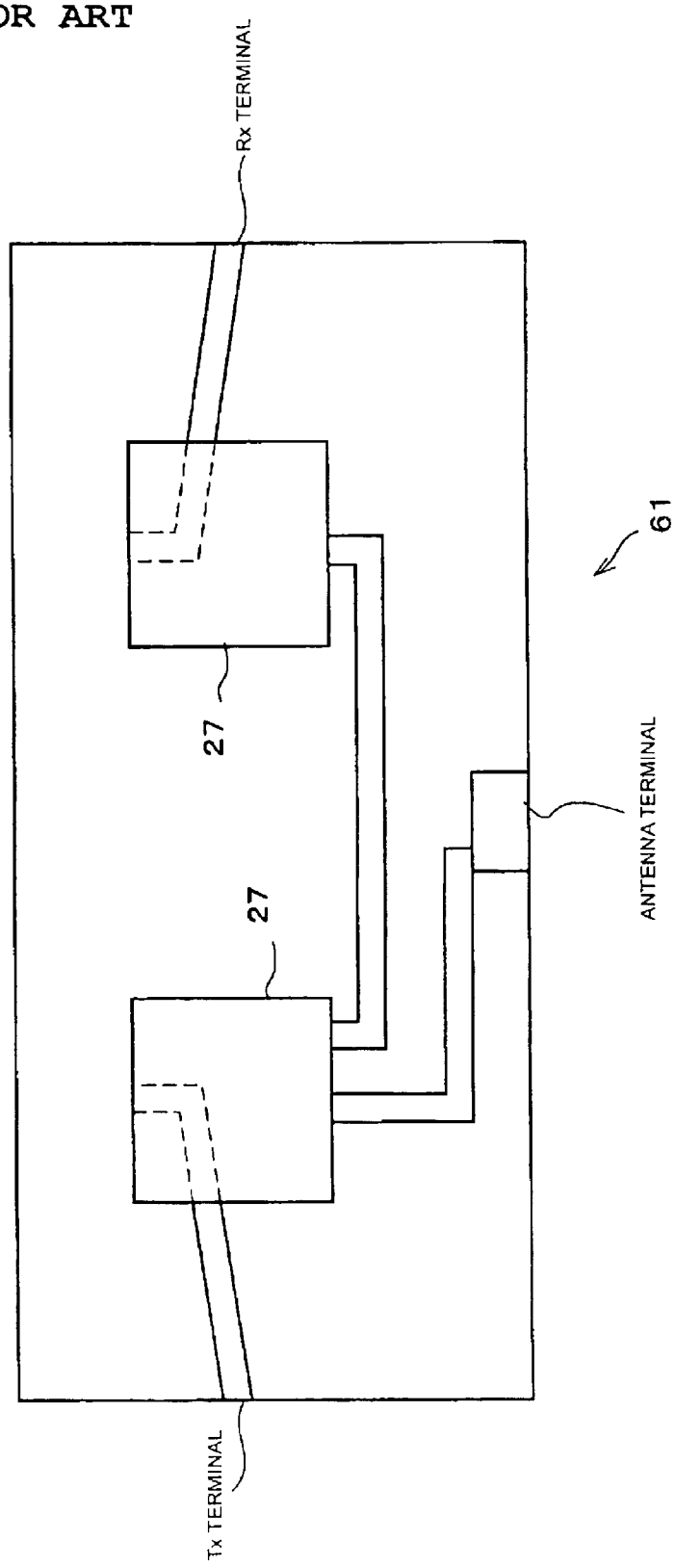
FIG. 14 is a top view showing the principal portion of another example of a related branching filter.

Then, up to now, although the packages of the SAW devices are rotated 45 degrees in order to make the branching filter smaller (see FIGS. 12 and 13), the wiring pattern for connection at the antenna coupling portion is complicated and, in addition, an additional wiring pattern is required for wiring from the transmission-side input terminal and reception-side output terminal in the package to the signal terminals of the branching filter.

In contrast, in preferred embodiments of the present invention, since the signal terminals are provided in the corner portions, it becomes possible to make branching filters and composite electronic components smaller than in the related products. Except for the branching filters, when a plurality of SAW devices are mounted in a larger circuit block and electrically connected, the wiring in the block becomes easier and the block can thus be made smaller.

Furthermore, in preferred embodiments of the present invention, since the transmission input terminal and reception output terminal are disposed at the farthest locations from each other on a diagonal, the isolation between the transmission side and the reception side can be kept high.

Figure 7:
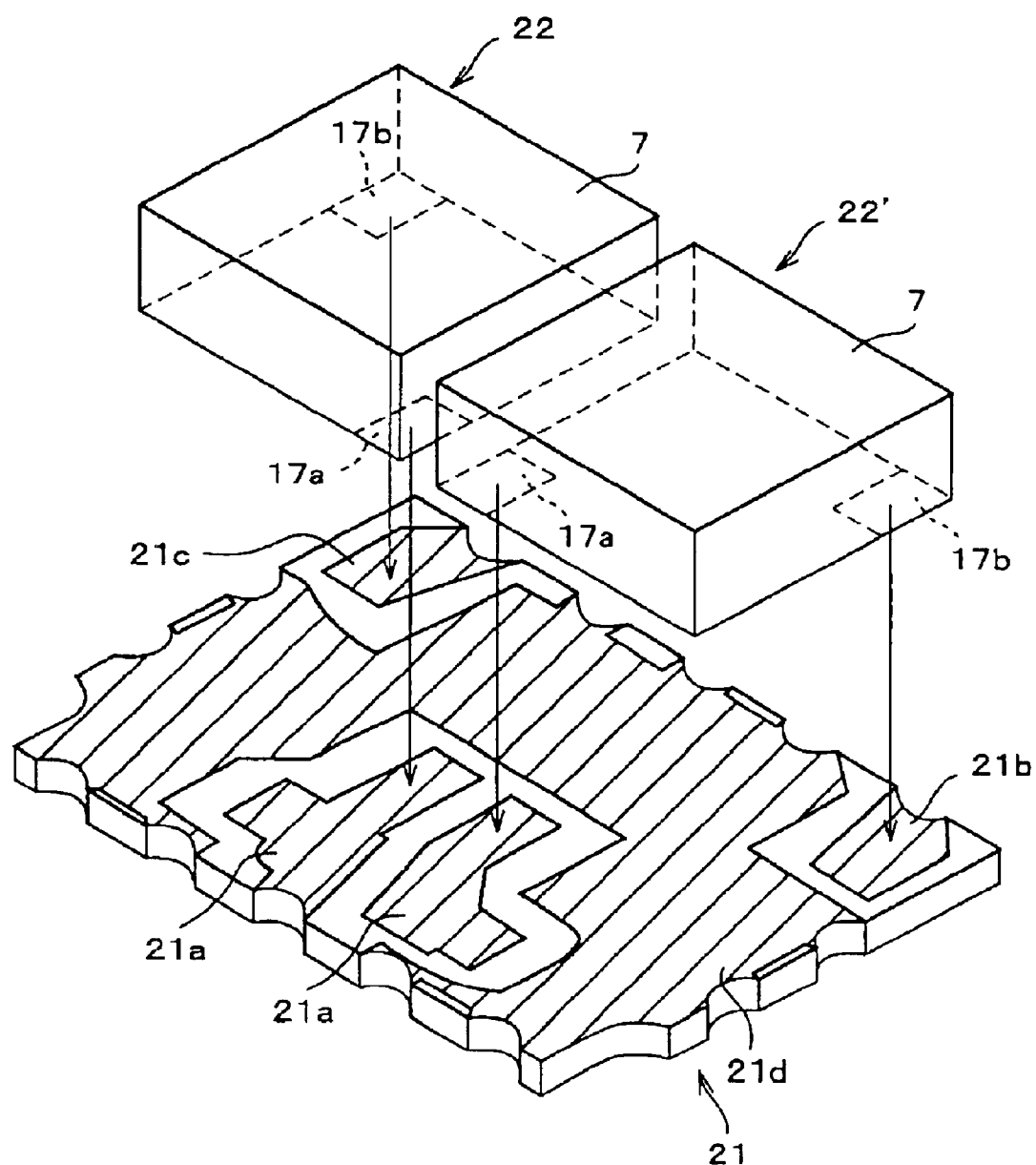
FIG. 7 is a top view of the principal portion of one modification of the branching filter of a preferred embodiment of the present invention.

Moreover, as shown in FIG. 7, when SAW devices 22 and 22', in which the signal terminals 17a and 17b are disposed on a diagonal on the two sides of the package 7, are densely mounted so that the total mounting area for the SAW devices 22 and 22' is substantially equal to the mounting area on the circuit board 21 and the size has been reduced as much as possible, since the signal terminals 17a for transmission and reception on the antenna terminal side are close together and the other signal terminals 17b are disposed in the corner portions (corner portions 9), that is, the terminals 17b are separated from each other as much as possible, the isolation between the transmission side and the reception side is very high.

In addition, in the above-described construction, the wiring pattern 21a for the antenna terminal is provided in the middle of one side of the circuit board 21, and the wiring pattern 21b on the reception side and the wiring pattern 21c on the transmission side may be provided in the corners of the other side, opposite to the above-described side. Accordingly, the wiring pattern to the terminal surface on the reception and transmission sides on the circuit board 21, which has been required until now, can be eliminated and therefore the area for the wiring pattern 21d for grounding can be increased. As a result, the isolation between the transmission side and the reception side can be kept high.

Then, in order to obtain desired branching filter characteristics in a limited area, the layout for mounting the SAW devices 22 and 23 and the matching elements 24, 25, and 26 is very important. For example, when relatively many elements are used in existing designs and redesign is performed to reduce the size, a certain reduction in size and elimination of the elements is possible. However, in this case, in order to reduce the size of the SAW devices, major design changes would be required to improve in withstand power and impedance.

Figure 8B:
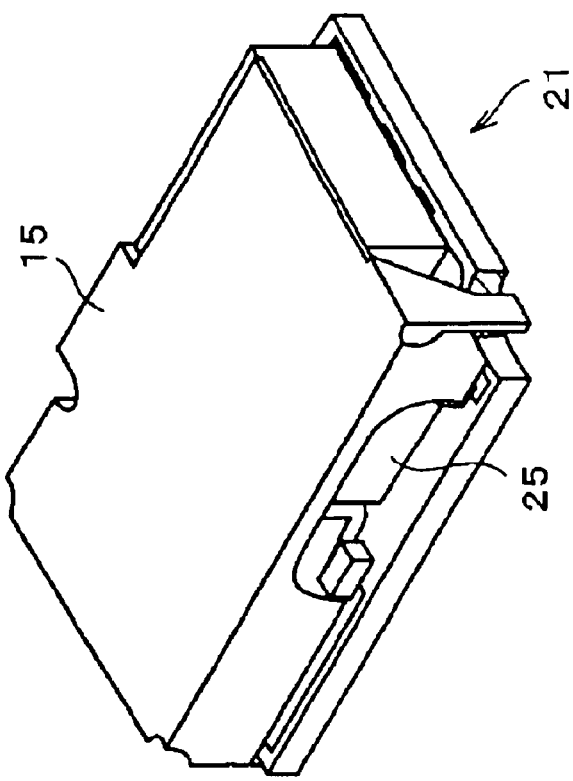
FIG. 8B is a schematic illustration showing another modification of the branching filter of a preferred embodiment of the present invention, which is a perspective view of the principal portion with a metal cover placed thereon.

Furthermore, because of the problem of shielding the wiring patterns 21a, 21b, and 21c, which are signal lines, and the matching elements 24, 25, and 26, as shown in FIG. 8B, a metal cover 15 is also required to be attached. That is, the area for the package 7 for the SAW devices, the matching circuits 24, 25, and 26, and an extra space for soldering the metal cover 15 becomes the area of the final product.

Figure 8A:
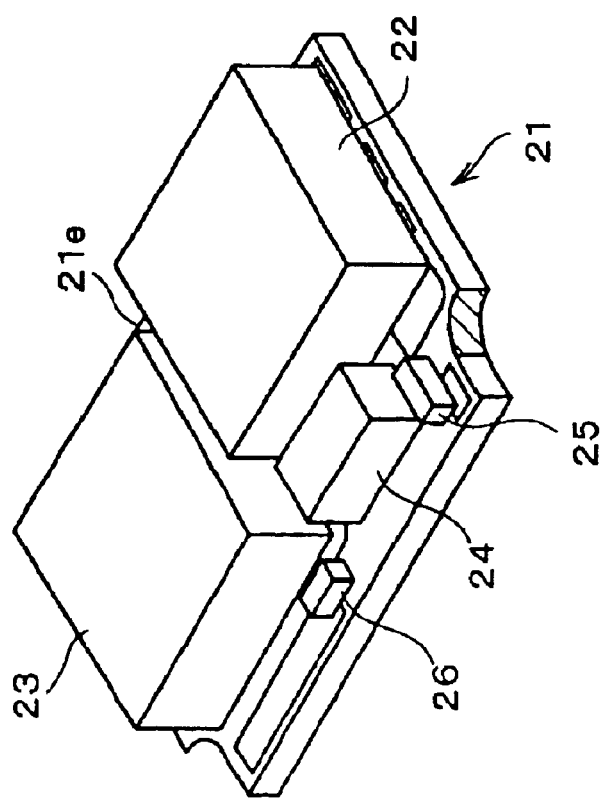
FIG. 8A is a schematic illustration showing another modification of the branching filter of a preferred embodiment of the present invention, which is a perspective view of the principal portion in which two SAW devices are displaced from each other and a metal cover is removed.

In preferred embodiments of the present invention, as shown in FIG. 8A, the SAW devices 22 and 23 may be mounted such that they are displaced from each other along the longitudinal direction of the surface opposite to the circuit board 21, the matching elements 24, 25, and 26 are disposed between the SAW device 22 on the reception (Rx) side and the side of the circuit board 21 on the circuit board 21, and a space 21e for a metal cover is disposed between the SAW device 23 on the transmission (Tx) side and the side portion of the circuit board 21 on the circuit board 21. On such a circuit board 21, as shown in FIG. 8B, a reduction in size can be achieved while the matching elements 24, 25, and 26 and the metal cover 15 are mounted by placing the metal cover 15, using the space 21e for the metal cover, so as to cover the SAW devices 22 and 23 and the matching elements 23, 25, and 26.

A SAW device of preferred embodiments of the present invention is constructed such that, as described above, signal terminals are provided at least on two sides of a package in which a SAW filter is mounted and that at least one of an input signal terminal and an output signal terminal for the SAW filter is disposed at ends of one side of the package.

Therefore, in the above-described construction, since the signal terminals are disposed as described above, the wiring pattern connected to the signal terminals is significantly shortened and interference is suppressed and minimized in the pass band, and, as a result, the attenuation is greatly increased in the pass band.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A branching filter comprising:
   a circuit board; and
   at least two surface acoustic wave devices for transmission and reception, each of the at least two surface acoustic wave devices comprising:
      a package having terminals on at least two sides thereof, one of the at least two sides of the package having at least three terminals; and
      a surface acoustic wave filter mounted in the package; wherein
      one of the terminals is used for inputting a signal to the surface acoustic wave filter and another of the terminals is used for outputting a signal from the surface acoustic wave filter; and
      at least one of the terminal for inputting a signal and the terminal for outputting a signal is disposed at the end of one side of the package; wherein
   the at least two surface acoustic wave devices are disposed on the circuit board such that signal terminals shared by the at least two surface acoustic wave devices are adjacent to each other on antenna sides of the at least two surface acoustic wave devices.

2. A surface acoustic wave device as claimed in claim 1, wherein the terminal for inputting a signal and the terminal for outputting a signal in the surface acoustic wave device for transmission are disposed at the two ends of the same side of the corresponding package.

3. A branching filter as claimed in claim 1, wherein the package of the surface acoustic wave device for transmission and the package of the surface acoustic wave device for reception are arranged so as to be spaced from each other.

4. A branching filter as claimed in claim 1, wherein a matching electronic component to be connected to a coupling portion on an antenna side of the at least two surface acoustic wave devices for transmission and reception is provided and wherein a conductive cover is mounted so as to cover the matching electronic component and the at least two surface acoustic wave devices.

5. A branching filter comprising:
   a circuit board; and
   at least two surface acoustic wave devices for transmission and reception, each of the at least two surface acoustic wave devices comprising:
      a package having terminals on at least two sides thereof, one of the at least two sides of the package having at least three terminals; and
      a surface acoustic wave filter mounted in the package; wherein
      one of the terminals is used for inputting a signal to the surface acoustic wave filter and another of the terminals is used for outputting a signal from the surface acoustic wave filter; and
      at least one of the terminal for inputting a signal and the terminal for outputting a signal is disposed at the end of one side of the package; wherein
   the signal terminal for inputting and the signal terminal for outputting in the surface acoustic wave device for reception are disposed on a diagonal of the corresponding package.

6. A branching filter comprising:
   a circuit board; and
   at least two surface acoustic wave devices for transmission and reception, each of the at least two surface acoustic wave devices comprising:
      a package having terminals on at least two sides thereof, one of the at least two sides of the package having at least three terminals; and
      a surface acoustic wave filter mounted in the package; wherein
      one of the terminals is used for inputting a signal to the surface acoustic wave filter and another of the terminals is used for outputting a signal from the surface acoustic wave filter; and at least one of the terminal for inputting a signal and the terminal for outputting a signal is disposed at the end of one side of the package; wherein the input-side terminal of the surface acoustic wave device for transmission and the output-side terminal of the surface acoustic wave device for reception are disposed at sides which are different from the sides located adjacent to each other in the at least two surface acoustic wave devices.

7. A branching filter as claimed in claim 6, wherein the input-side terminal of the surface acoustic wave device for transmission is disposed at a corner portion of the surface acoustic wave device for transmission and the output-side terminal of the surface acoustic wave device for reception is disposed at a corner portion of the surface acoustic wave device for reception which is spaced farther away from the corner portion of the surface acoustic wave device for transmission at which the input-side terminal is disposed than any other corner portion of the surface acoustic wave device for reception.

8. A branching filter comprising:

a circuit board;

at least two surface acoustic wave devices for transmission and reception, each of the at least two surface acoustic wave devices comprising:
   a package having terminals on at least two sides thereof, one of the at least two sides of the package having at least three terminals; and
   a surface acoustic wave filter mounted in the package; wherein
   one of the terminals is used for inputting a signal to the surface acoustic wave filter and another of the terminals is used for outputting a signal from the surface acoustic wave filter; and
   at least one of the terminal for inputting a signal and the terminal for outputting a signal is disposed at the end of one side of the package; wherein the input-side terminal of the surface acoustic wave device for transmission is disposed at a corner portion of the surface acoustic wave device for transmission and the output-side terminal of the surface acoustic wave device for reception is disposed at a corner portion of the surface acoustic wave device for reception that is spaced farther away from the corner portion of the surface acoustic wave device for transmission at which the input-side terminal is disposed than any other corner portion of the surface acoustic wave device for reception.

9. A branching filter comprising:

a circuit board; and at least two surface acoustic wave devices for transmission and reception, each of the at least two surface acoustic wave devices comprising:
   a package having terminals on at least two sides thereof, one of the at least two sides of the package having at least three terminals; and
   a surface acoustic wave filter mounted in the package; wherein
   one of the terminals is used for inputting a signal to the surface acoustic wave filter and another of the terminals is used for outputting a signal from the surface acoustic wave filter; and
   at least one of the terminal for inputting a signal and the terminal for outputting a signal is disposed at a corner of the package; wherein the at least two surface acoustic wave devices are disposed on the circuit board such that terminals shared by the at least two surface acoustic wave devices are adjacent to each other on antenna sides of the at least two surface acoustic wave devices.

10. A branching filter comprising:

a circuit board; and at least two surface acoustic wave devices for transmission and reception, each of the at least two surface acoustic wave devices comprising:
   a package having terminals on at least two sides thereof, one of the at least two sides of the package having at least three terminals; and
   a surface acoustic wave filter mounted in the package; wherein
   one of the terminals is used for inputting a signal to the surface acoustic wave filter and another of the terminals is used for outputting a signal from the surface acoustic wave filter; and
   at least one of the terminal for inputting a signal and the terminal for outputting a signal is disposed at a corner of the package; wherein the terminal for inputting a signal and the terminal for outputting a signal in the surface acoustic wave device for reception are disposed on a diagonal of the corresponding package.

11. A branching filter comprising;

a circuit board; and at least one surface acoustic wave device disposed on the circuit board, the at least one surface acoustic wave device comprising:
   a package having terminals on at least two sides thereof, one of the at least two sides of the package having at least three terminals; and
   a surface acoustic wave filter mounted in the package; wherein
   one of the terminals is used for inputting a signal to the surface acoustic wave filter and another of the terminals for outputting for the surface acoustic wave filter;
   the terminal for inputting a signal and the terminal for outputting a signal are disposed on a diagonal between two opposing sides of the package and at ends of the two opposing sides.

12. A branching filter as claimed in claim 11, wherein at least two surface acoustic wave devices for transmission and reception are provided and wherein the at least two surface acoustic wave devices are disposed on the circuit board such that terminals shared by the at least two surface acoustic wave devices are adjacent to each other on antenna sides of the at least two surface acoustic wave devices.

13. A branching filter as claimed in claim 11, wherein at least two surface acoustic wave devices for transmission and reception are provided and wherein the terminal for inputting a signal and the terminal for outputting a signal in the surface acoustic wave device for reception are disposed on a diagonal of the corresponding package.

* * * * *